United States Patent
Yanagisawa et al.

(10) Patent No.: US 6,528,982 B1
(45) Date of Patent: Mar. 4, 2003

(54) JITTER DETECTOR, PHASE DIFFERENCE DETECTOR AND JITTER DETECTING METHOD

(75) Inventors: Naoshi Yanagisawa, Osaka (JP); Shiro Dosho, Osaka (JP); Kazuhiko Nishikawa, Osaka (JP); Seiji Watanabe, Kyoto (JP); Takahiro Bokui, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 12 days.

(21) Appl. No.: 09/697,721

(22) Filed: Oct. 27, 2000

(30) Foreign Application Priority Data

Oct. 27, 1999 (JP) ............................... 11-305032

(51) Int. Cl.⁷ .................. G01R 25/00; G01R 13/00

(52) U.S. Cl. .................. 324/76.77; 702/72; 702/69; 324/76.82

(58) Field of Search .................. 324/76.62, 76.52, 324/76.53, 76.58, 76.65, 76.66, 76.77, 76.82; 702/69, 72

(56) References Cited

U.S. PATENT DOCUMENTS

| 5,663,942 A | 9/1997 | Ishibashi et al. | |
| 6,185,510 B1 | * 2/2001 | Inoue | 324/622 |
| 6,291,979 B1 | * 9/2001 | Soma et al. | 324/76.82 |

* cited by examiner

Primary Examiner—N. Le
Assistant Examiner—James C Kerveros
(74) Attorney, Agent, or Firm—McDermott, Will & Emery

(57) ABSTRACT

A jitter detector obtains a phase difference between input signals as a digital value to make jitter between the signals easily detectable. The jitter detector includes comparison pulse generator, periodic signal generator, counter and arithmetic unit. The comparison pulse generator outputs one phase difference comparison pulse after another. Each phase difference comparison pulse has a width representing the phase difference between first and second input signals. The periodic signal generator outputs a periodic signal every time a value obtained by accumulating the widths of the phase difference comparison pulses exceeds a predetermined value. Receiving the periodic signal and a clock signal with a period shorter than that of the periodic signal, the counter counts the number of pulses of the clock signal during one period of the periodic signal and outputs a resultant count. And the arithmetic unit detects and outputs a variation in the count as jitter between the first and second input signals.

3 Claims, 9 Drawing Sheets

JITTER DETECTOR, PHASE DIFFERENCE DETECTOR AND JITTER DETECTING METHOD

BACKGROUND OF THE INVENTION

The present invention relates to a phase difference detector for detecting a phase difference between two input signals and also relates to a jitter detector and jitter detecting method for detecting the amount of jitter between the two input signals.

FIG. 12 is a circuit diagram illustrating a configuration for a known phase difference detector 90. Hereinafter, it will be described how this circuit operates. First, two signals of a phase locked loop (PLL) circuit (not shown), i.e., the input and output of the PLL circuit, are provided as first and second input signals 101 and 102 to the phase difference detector 90. A comparison pulse generator 901 generates a pulse signal 902 that contains information about the phase difference between these two input signals. The pulse signal 902 is used as a control signal for charging pump current sources 9031 and 9032 and is converted into a current pulse. Accordingly, a charge, reflecting the phase difference between the input signals 101 and 102, is stored on a capacitor 904.

Next, a sample-and-hold (S/H) circuit 907 samples, holds and outputs a voltage of the capacitor 904 at respectively predetermined times. Thus, the sample-and-hold circuit 907 can output an analog voltage value representing the phase difference. After the voltage has been sampled and held, the capacitor 904 is reset by a switch 911, which turns ON at the same period as that of the sample-and-hold circuit 907.

Accordingly, every time the phases of the first and second input signals 101 and 102 are compared to each other, the resultant phase difference is output as an analog voltage from the sample-and-hold circuit 907. If the magnitude of this output is sufficiently great and if the output of this phase difference detector 90 may be an analog value, then the output of the sample-and-hold circuit 907 is used as the output of the phase difference detector 90.

An amplifier 906 amplifies the output voltage of the sample-and-hold circuit 907 and then outputs the amplified voltage. An A/D converter 908 performs A/D conversion on the output voltage of the amplifier 906, thereby outputting a digital value.

If the magnitude of the output of the sample-and-hold circuit 907 is not so great and if the output of this phase difference detector 90 may be an analog value, then the output of the amplifier 906 is used as the output of the phase difference detector 90. Alternatively, if the output of the phase difference detector 90 should be a digital value, then the output of the A/D converter 908 is used as the output of the phase difference detector 90.

Furthermore, by monitoring a variation in the phase difference between the two input signals that has been output from the phase difference detector 90, jitter between these input signals can be detected. Thus, the jitter created in the PLL circuit can be detected.

In the phase difference detector 90 like this, however, the capacitor 904 should be charged and the output voltage thereof should be monitored. Thus, an analog value is obtained as a first output. But it is difficult to monitor a variation of a potential that has been output as an analog value. Also, since the A/D converter 908 is needed to obtain a digital output value from the phase difference detector 90, the circuit size and power dissipation of the phase difference detector 90 both increase.

Furthermore, the amount of jitter should ideally be as small as possible, and therefore, it is normally necessary to monitor that very small jitter accurately enough. For that purpose, the phase difference detector 90 is required to either increase the quantity of charge stored on the capacitor 904 by raising the amount of currents supplied from the current sources 9031 and 9032 or amplify the monitored voltage by inserting the amplifier 906 into the output stage thereof.

Moreover, every time the phases are compared to each other, the voltage of the charged capacitor 904 should be sampled and held. Accordingly, the sample-and-hold circuit 907 should operate in a broad frequency band exceeding the frequencies of the input signals 101 and 102.

SUMMARY OF THE INVENTION

It is therefore an object of the present invention to provide a phase difference detector for outputting a phase difference between two input signals as a digital value without increasing the circuit size thereof.

Another object of the present invention is to provide a jitter detector and jitter detecting method that can detect jitter between the input signals much more easily by utilizing the digital value and without increasing the circuit size thereof.

An inventive jitter detector detects and outputs jitter between first and second input signals as a variation in period of a periodic signal by: receiving the first and second input signals and a clock signal; sequentially accumulating phase differences between the first and second input signals; generating the periodic signal every time a result of the accumulation exceeds a predetermined value; and obtaining the period of the periodic signal based on a period of the clock signal.

Another inventive jitter detector includes comparison pulse generator, periodic signal generator, counter and arithmetic unit. The comparison pulse generator outputs one phase difference comparison pulse after another. Each phase difference comparison pulse has a width representing a phase difference between first and second input signals. The periodic signal generator outputs a periodic signal every time a value obtained by accumulating the widths of the phase difference comparison pulses exceeds a predetermined value. The counter receives the periodic signal and a clock signal with a period shorter than a period of the periodic signal, counts the number of pulses of the clock signal during one period of the periodic signal and outputs a resultant count. And the arithmetic unit detects and outputs a variation in the count as jitter between the first and second input signals.

According to the present invention, a phase difference between input signals is converted into a digital value representing the period of a periodic signal and the jitter is detected based on this value. Thus, the jitter can be obtained without using any A/D converter or the like. In addition, an average jitter over multiple periods and a variance, which is used as an index to a variation in jitter, can also be easily calculated.

In one embodiment of the present invention, the periodic signal generator may include charging pump circuit, capacitor and comparator. The charging pump circuit outputs a charge in a quantity corresponding to the width of each said phase difference comparison pulse. The capacitor stores thereon the charge that has been output from the charging pump circuit. And comparator compares a voltage of the capacitor to a predetermined reference voltage. When the periodic signal is output, the capacitor discharges. And every time the voltage of the capacitor exceeds the reference voltage, the comparator outputs the periodic signal.

In such an embodiment, the widths of the phase difference comparison pulses are accumulated after having been converted into charge quantities. Thus, the widths of the phase difference comparison pulses can be accumulated easily.

In another embodiment of the present invention, the jitter detector may further include an edge detector for converting the first and second input signals into first and second timing signals, respectively. The edge detector outputs the first and second timing signals as input signals for the comparison pulse generator. The first timing signal has an edge synchronized with a first edge of the first input signal. The second timing signal has an edge synchronized with a second edge of the second input signal and also has a period approximately equal in length to a period of the first input signal. And a time-lag between the first and second edges is equal to or shorter than a period of the second input signal.

In such an embodiment, even if the frequency of the second input signal is approximately n times (where n is an integer) as high as that of the first input signal, the jitter between these input signals is easily detectable, too.

Still another inventive jitter detector includes differential signal converter, periodic signal generator, counter and arithmetic unit. The differential signal converter converts a first input signal into first and second differential signals and a second input signal into third and fourth differential signals. The first and second differential signals are non-inverted and inverted against the first input signal, respectively, while the third and fourth differential signals are non-inverted and inverted against the second input signal, respectively. The periodic signal generator obtains one phase difference comparison pulse after another responsive to the first through fourth differential signals. Each phase difference comparison pulse has a width representing a phase difference between the first and second input signals. The periodic signal generator outputs a periodic signal every time a value obtained by accumulating the widths of the phase difference comparison pulses exceeds a predetermined value. The counter receives the periodic signal and a clock signal with a period shorter than a period of the periodic signal, counts the number of pulses of the clock signal during one period of the periodic signal and outputs a resultant count. And arithmetic unit detects and outputs a variation in the count as jitter between the first and second input signals.

In such an embodiment, the phase difference comparison pulses can be obtained by using a relatively simple configuration.

In one embodiment of the present invention, the periodic signal generator may include charging pump circuit, capacitor and comparator. The charging pump circuit performs an OR operation on a logical product of the first and fourth differential signals and a logical product of the second and third differential signals to obtain a logical sum of these logical products as each phase difference comparison pulse. The charging pumping circuit also outputs a charge in a quantity corresponding to the width of the phase difference comparison pulse. The capacitor stores thereon the charge that has been output from the charging pump circuit. And the comparator compares a voltage of the capacitor to a predetermined reference voltage. When the periodic signal is output, the capacitor discharges. And every time the voltage of the capacitor exceeds the reference voltage, the comparator outputs the periodic signal.

In such an embodiment, even when the phase difference comparison pulses are obtained responsive to the differential signals, the pulse widths are also accumulated as charge quantities. Thus, the widths of the phase difference comparison pulses can be accumulated easily.

In an alternative embodiment, the jitter detector may further include an edge detector for converting the first and second input signals into first and second timing signals, respectively. The edge detector outputs the first and second timing signals as input signals for the differential signal converter. The first timing signal has an edge synchronized with a first edge of the first input signal. The second timing signal has an edge synchronized with a second edge of the second input signal and also has a period approximately equal in length to a period of the first input signal. And a time-lag between the first and second edges is equal to or shorter than a period of the second input signal.

In such an embodiment, even if the frequency of the second input signal is approximately n times as high as that of the first input signal where the phase difference comparison pulses should be obtained responsive to the differential signals, the jitter between these input signals is also easily detectable.

An inventive phase difference detector outputs a phase difference between first and second input signals as a period of a periodic signal by: receiving the first and second input signals and a clock signal; sequentially accumulating phase differences between the first and second input signals; generating the periodic signal every time a result of the accumulation exceeds a predetermined value; and obtaining the period of the periodic signal based on a period of the clock signal.

In such an embodiment, a value corresponding to the phase difference between the input signals can be obtained as a digital value without using any A/D converter or the like.

An inventive jitter detecting method is adapted to detect jitter between first and second input signals as a variation in period of a periodic signal. The method includes the steps of: sequentially accumulating phase differences between the first and second input signals; generating the periodic signal every time a result of the accumulation exceeds a predetermined value; and obtaining the period of the periodic signal based on a period of a clock signal.

In such an embodiment, a value corresponding to the phase difference between the input signals can be obtained as a digital value without using any A/D converter or the like. Thus, the average or variance of the jitter can be easily obtained.

It should be noted that the "clock signal" herein includes a pulse signal with a constant period shorter than that of the periodic signal.

DESCRIPTION OF THE PREFERRED EMBODIMENTS

Hereinafter, preferred embodiments of the present invention will be described with reference to the accompanying drawings.

Embodiment 1

Figure 1:
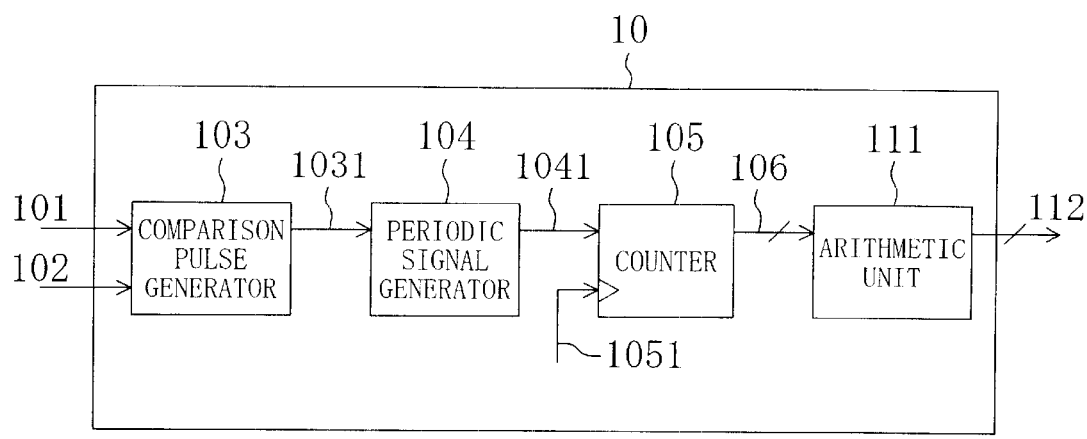
FIG. 1 is a block diagram illustrating a configuration for a jitter detector according to a first embodiment of the present invention.

FIG. 1 is a block diagram illustrating a configuration for a jitter detector according to a first embodiment of the present invention. As shown in FIG. 1, the jitter detector 10 includes comparison pulse generator 103, periodic signal generator 104, counter 105 and arithmetic unit 111.

In response to first and second input signals 101 and 102, the comparison pulse generator 103 generates a phase difference comparison pulse 1031 with a pulse width representing the phase difference between the first and second input signals 101 and 102. Then, the pulse generator 103 outputs the pulse 1031 to the periodic signal generator 104. At an interval corresponding to the cumulative pulse width of the input phase difference comparison pulse 1031, the periodic signal generator 104 generates and outputs a periodic signal 1041 to the counter 105.

The counter 105 receives the periodic signal 1041 and a clock signal 1051, counts the number of pulses of the clock signal 1051 received during one period of the periodic signal 1041 and outputs the count 106 to the arithmetic unit 111. Then, the arithmetic unit 111 obtains a variation in the count 106 as the jitter between the first and second input signals and provides the jitter as the output 112 of the jitter detector 10.

In the illustrated embodiment, the first and second input signals 101 and 102 supplied to the jitter detector 10 are supposed to have approximately equal frequencies when stabilized.

Figure 2:
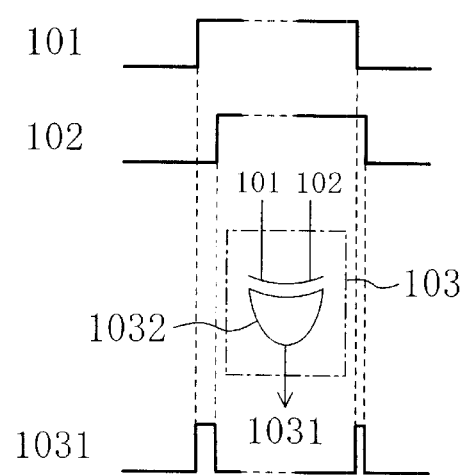
FIG. 2 illustrates a configuration for the comparison pulse generator shown in FIG. 1 and a timing diagram for the input and output signals of the pulse generator.

FIG. 2 illustrates a configuration for the comparison pulse generator 103 and a timing diagram for the input and output signals of the pulse generator 103. Specifically, the comparison pulse generator 103 includes an exclusive-OR (EXOR) gate 1032.

As shown in FIG. 2, the EXOR gate 1032 receives the first and second input signals 101 and 102 and generates one phase difference comparison pulse 1031 after another. Each phase difference comparison pulse has a pulse width representing a phase difference between the leading or trailing edges of the input signals 101 and 102.

Figure 3:
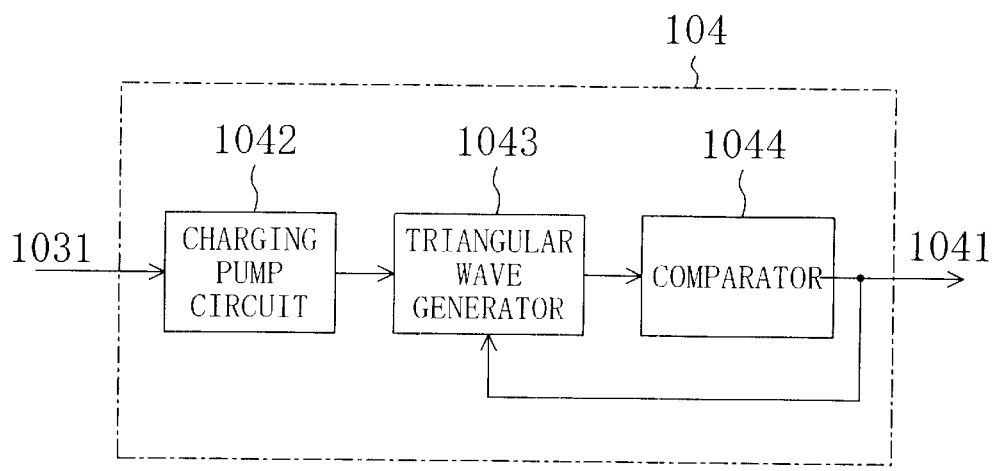
FIG. 3 is a block diagram illustrating a configuration for the periodic signal generator shown in FIG. 1.

FIG. 3 is a block diagram illustrating a configuration for the periodic signal generator 104 shown in FIG. 1. As shown in FIG. 3, the periodic signal generator 104 includes charging pump circuit 1042, triangular wave generator 1043 and comparator 1044.

Figure 4:
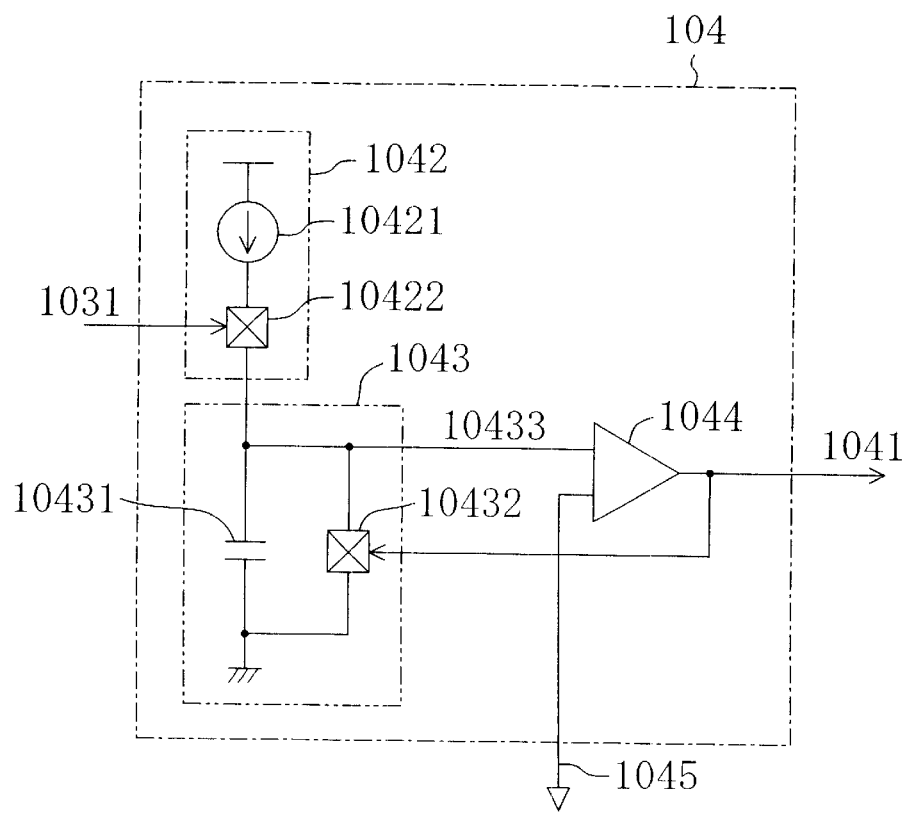
FIG. 4 is a circuit diagram illustrating a more detailed configuration for the periodic signal generator shown in FIG. 3.

FIG. 4 is a circuit diagram illustrating a more detailed configuration for the periodic signal generator 104 shown in FIG. 3. As shown in FIG. 4, the charging pump circuit 1042 includes current source 10421 and switch 10422, while the triangular wave generator 1043 includes capacitor 10431 and switch 10432.

Hereinafter, it will be described with reference to FIGS. 3 and 4 how the periodic signal generator 104 operates. The switch 10422 turns ON only when the phase difference comparison pulse 1031 is at a logically high potential level (which will be herein denoted as the "H" level) to pass the output current of the current source 10421 to the capacitor 10431. The amount of the current output from the current source 10421 is constant.

Accordingly, the phase difference between the first and second input signals 101 and 102 is firstly represented as a time quantity, i.e., the pulse width of the phase difference comparison pulse 1031. Then, the charging pump circuit 1042 converts the phase difference comparison pulse 1031 into a current pulse with the same pulse width. That is to say, the phase difference is converted into a charge quantity.

The capacitor 10431 sequentially stores this charge. The voltage of the capacitor 10431, i.e., a potential level at a node 10433, is variable with the quantity of the charge that has been stored on the capacitor 10431. In other words, the potential level at the node 10433 is determined depending on the capacitance value of the capacitor 10431 and the cumulative phase difference between the first and second input signals 101 and 102.

The comparator 1044 receives the potential level at the node 10433 and a reference signal 1045 as first and second inputs thereof, respectively. The reference signal 1045 is a signal with a constant reference voltage RV, which may be set to an arbitrary value. Every time the comparator 1044 has received a clock pulse (not shown), for example, the comparator 1044 compares the potentials at the first and second inputs to each other. A point in time when these potentials are compared will be herein called "comparison timing".

If the potential level at the node 10433 has exceeded the potential level of the reference signal 1045, then the comparator 1044 raises its output to the "H" level at the comparison timing. The triangular wave generator 1043 includes a switch 10432 for resetting the capacitor 10431. The output 1041 of the comparator 1044 is provided as control input to the switch 10432 so that the switch 10432 can discharge the capacitor 10431 and thereby initialize the potential level at the node 10433 to zero.

That is to say, the potential level at the node 10433 is proportional to the cumulative phase difference between the first and second input signals 101 and 102. Accordingly, every time the phase difference comparison pulse 1031 is input to the switch 10422, the potential level at the node 10433 rises with the phase difference between these two input signals 101 and 102. When the potential level at the node 10433 exceeds that of the reference signal 1045 at the comparison timing, the output 1041 of the comparator 1044 rises to the "H" level, thereby turning the switch 10432 ON and discharging and resetting the capacitor 10431. At the next comparison timing, the output 1041 of the comparator 1044 falls to the logically low potential level (which will be herein called an "L" level). As a result, the switch 10432 turns OFF and the capacitor 10431 starts re-storing the charge at this point in time.

The interval between the comparison timings can be longer than the periods of the first and second input signals 101 and 102. Accordingly, the comparator 1044 does not have to operate so fast.

Figure 5:
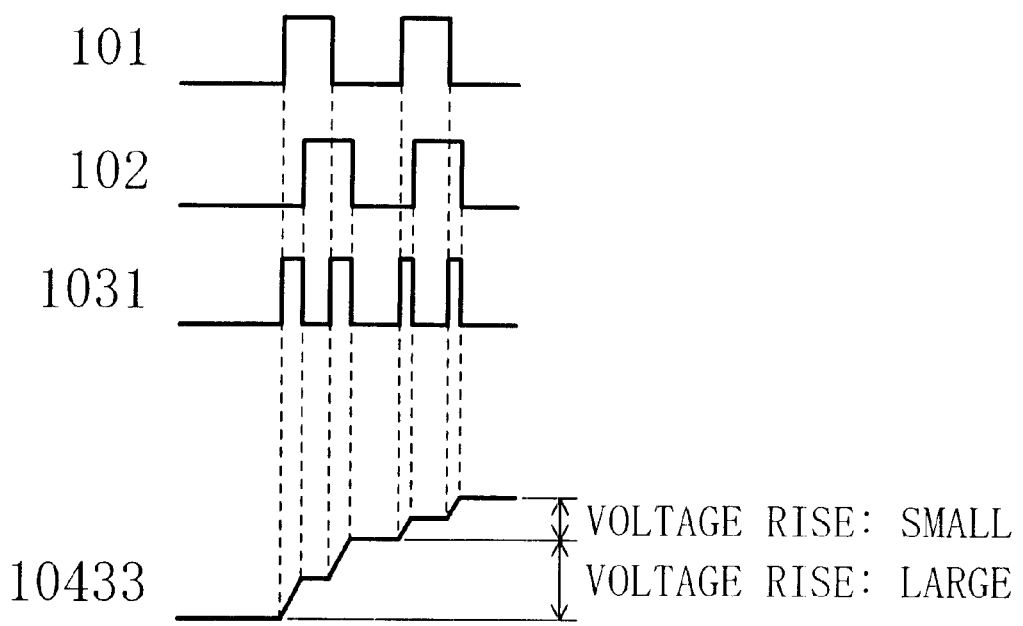
FIG. 5 is a graph illustrating a relationship between a phase difference comparison pulse and a voltage at a node of the positive electrode of the capacitor shown in FIG. 4.

FIG. 5 is a graph illustrating a relationship between the phase difference comparison pulse 1031 and a voltage at the node 10433. As described above, the charging pump circuit 1042 and triangular wave generator 1043 operate as a time/voltage converter.

The pulse width of the phase difference comparison pulse 1031 represents the length of an interval for which the capacitor 10431 is charged. Accordingly, as shown in FIG. 5, if the pulse width of the phase difference comparison pulse 1031 is relatively large, then the voltage at the node 10433 (i.e., the potential level at the node 10433 as measured with respect to a ground potential) rises significantly. Conversely, if the pulse width is relatively small, then the voltage at the node 10433 does not rise so much.

In view of these respects, the output of the comparator 1044 becomes the periodic signal 1041. The periodic signal 1041 is a pulse train with a period corresponding to the cumulative phase difference between the first and second input signals 101 and 102.

Figure 6:
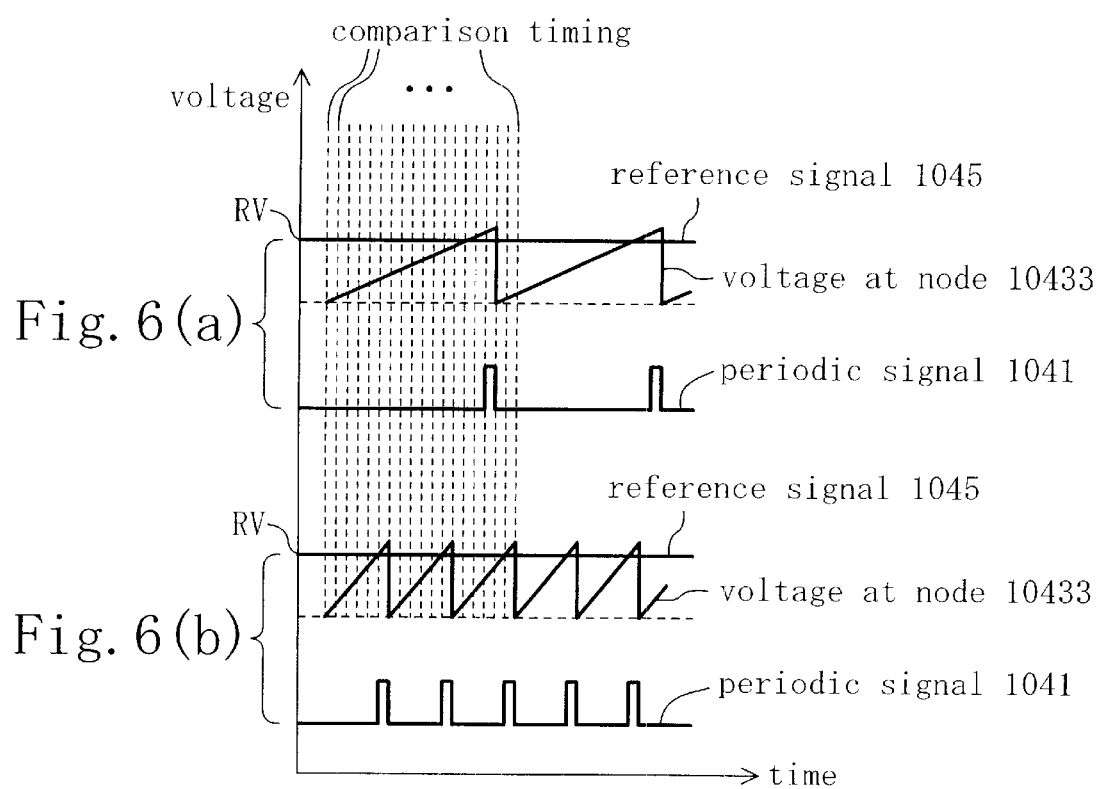
FIG. 6 is a graph illustrating the waveforms of input and output signals of the comparator shown in FIG. 4.

FIG. 6 is a graph illustrating the waveforms of the input and output signals of the comparator 1044. Hereinafter, it will be described with reference to FIG. 6 how the count 106 output from the counter 105 changes with the phase difference between the first and second input signals 101 and 102.

FIG. 6-(*a*) illustrates a situation where the phase difference between the input signals 101 and 102 is relatively small. In that case, as already described with reference to FIG. 5, the pulse width of the phase difference comparison pulse 1031 is relatively narrow, and therefore, the voltage at the node 10433 rises rather gently every time the pulse 1031 is applied.

That is to say, in that situation, the phases are compared to each other a greater number of times until the voltage of the capacitor 10431 gets equal to the reference voltage RV. Accordingly, it takes a longer time before the output of the comparator 1044 changes. As a result, the periodic signal 1041 comes to have a longer period and the count 106 of the counter 105 will be relatively large.

On the other hand, FIG. 6-(*b*) illustrates a situation where the phase difference between the input signals 101 and 102 is relatively large. In that case, the pulse width of the phase difference comparison pulse 1031 is relatively broad, and the voltage at the node 10433 rises steeply every time the pulse 1031 is applied.

That is to say, in that situation, the phases are compared to each other a fewer number of times until the voltage of the capacitor 10431 gets equal to the reference voltage RV. Accordingly, it takes a much shorter time before the output of the comparator 1044 changes. As a result, the periodic signal 1041 comes to have a shorter period and the count 106 of the counter 105 will be relatively small.

In this manner, the cumulative phase difference between the first and second input signals 101 and 102 is converted into the period of the periodic signal 1041. And the number of pulses of the clock signal 1051 that have been applied during one period of this periodic signal 1041 is obtained as the count 106. The count 106 may be regarded as corresponding to a value obtained by averaging the phase differences between the two input signals 101 and 102 over one period of the periodic signal 1041. In addition, since this count 106 is a digital value, the arithmetic unit 111 can easily obtain and output the jitter based on this count 106.

For example, the first and second input signals 101 and 102 may be a reference input signal and an output signal of a PLL circuit (not shown), respectively. In that case, the amount of jitter can be measured for the output signal of the PLL circuit based on the count 106.

It should be noted that a circuit obtained by removing the arithmetic unit 111 from the jitter detector 10 shown in FIG. 1, i.e., a circuit including the comparison pulse generator 103, periodic signal generator 104 and counter 105, operates as a phase difference detector. And the phase difference detector can output a digital value corresponding to an averaged phase difference between the two input signals 101 and 102.

In the foregoing embodiment, phase difference comparison pulses 1031 are input to the periodic signal generator 104 so that the pulse widths are represented as a phase difference between the leading edges of the two input signals 101 and 102 and a phase difference between the trailing edges thereof. Alternatively, unnecessary pulses may be removed from the output of the comparison pulse generator 103 so that only the phase difference comparison pulses, the pulse widths of which are represented as the phase differences between either the leading or trailing edges of the input signals, are input the periodic signal generator 104.

Embodiment 2

Hereinafter, a second embodiment of the present invention will be described. In the jitter detector of the second embodiment, the frequency of the second input signal 102 is approximately n times (where n is a positive integer) as high as that of the first input signal 101. In the second embodiment, the comparison pulse generator 103 of the first embodiment is replaced with a comparison pulse generator 108. The other components of the second embodiment are the same as the counterparts of the first embodiment. Thus, those like components are identified by the same reference numeral and the description thereof will be omitted herein.

Figure 7:
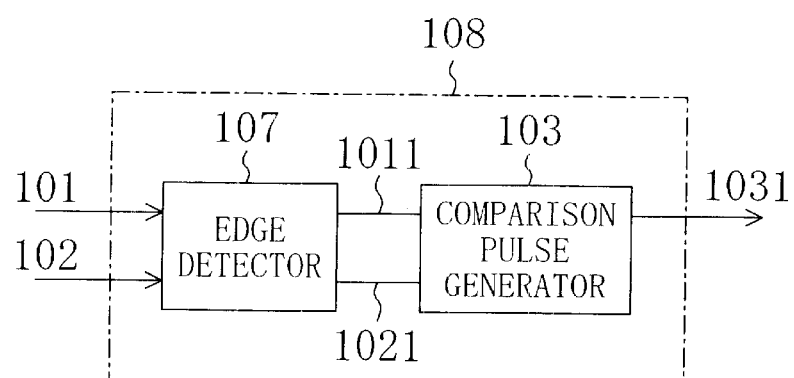
FIG. 7 is a block diagram illustrating a configuration for a comparison pulse generator according to a second embodiment of the present invention.

FIG. 7 is a block diagram illustrating a configuration for the comparison pulse generator 108 according to the second embodiment. As shown in FIG. 7, the comparison pulse generator 108 further includes an edge detector 107 in addition to the comparison pulse generator 103.

Receiving the first and second input signals 101 and 102, the edge detector 107 converts the first and second input signals 101 and 102 into first and second timing signals 1011 and 1021 and then outputs the signals 1011 and 1021 to the comparison pulse generator 103.

First, the edge detector 107 obtains the first timing signal 1011 with an edge synchronized with a leading edge of the first input signal 101 (i.e., the first edge). Next, the edge detector 107 finds out the leading edge of the second input signal 102 (i.e., the second edge that should be synchronized with the first edge) within a range consisting of an interval T2 preceding the first edge and another interval T2 succeeding the first edge. Herein, the interval T2 is equal in length to the period of the second input signal 102. The edge detector 107 obtains the second timing signal 1021 having an edge synchronized with the second edge. The pulse widths of the first and second timing signals 1011 and 1021 are each equal to or less than the interval T2.

Figure 8:
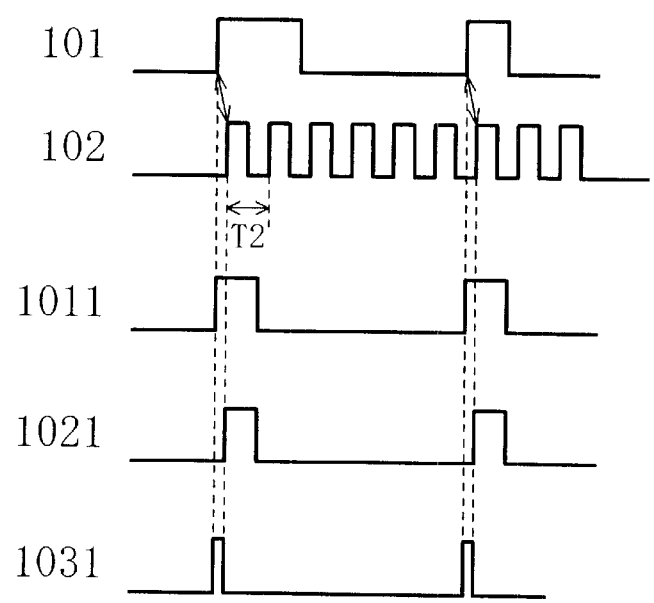
FIG. 8 is a timing diagram illustrating the waveforms of respective signals for the comparison pulse generator shown in FIG. 7.

FIG. 8 is a timing diagram illustrating the waveforms of respective signals for the comparison pulse generator 108. As shown in FIG. 8, the first timing signal 1011 rises at the same time with the first input signal 101, and falls approximately after the interval T2 has passed. The second timing signal 1021 rises with the leading edge of the second input signal 102 that should be synchronous with that of the first input signal 101 (i.e., the leading edge of the second input signal 102 that is closest in time to the leading edge of the first input signal 101). And approximately after the interval T2 has passed, the second timing signal 1021 also falls.

Accordingly, even if the frequency of the second input signal 102 is higher than that of the first input signal 101, the period of the second timing signal 1021 is approximately equal to that of the first timing signal 1011.

The first and second timing signals 1011 and 1021 are provided as two input signals to the comparison pulse generator 103. The comparison pulse generator 103 outputs the phase difference between the first and second timing signals 1011 and 1021 (i.e., the phase difference between the first and second input signals 101 and 102) as the pulse width of the phase difference comparison pulse 1031.

Thus, if the frequency of the second input signal 102 is approximately n time higher than that of the first input signal 101 in a stabilized state, then those signals can be input to the comparison pulse generator 103 by way of the edge detector 107. In the example illustrated in FIG. 8, the first input signal 101 is ahead of the second input signal 102. However, the same statements are applicable to the opposite situation where the second input signal 102 is ahead of the first input signal 101.

For example, the jitter detector of the second embodiment is applicable to a clock extractor, which generates a clock signal synchronously with a data signal, by supplying the data signal and clock signal as the first and second input signals 101 and 102, respectively, to the jitter detector.

Embodiment 3

Figure 9:
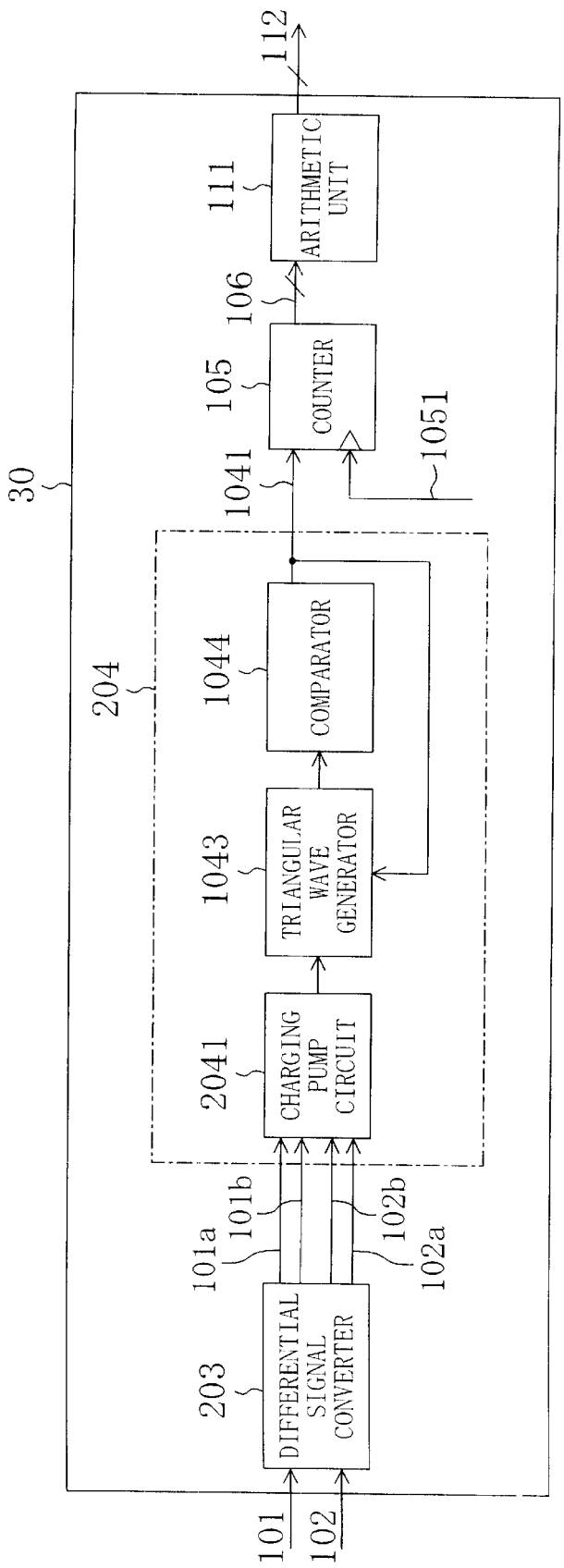
FIG. 9 is a block diagram illustrating a configuration for a jitter detector according to a third embodiment of the present invention.

FIG. 9 is a block diagram illustrating a configuration for a jitter detector 30 according to a third embodiment of the present invention. In the jitter detector 30 shown in FIG. 9, the comparison pulse generator 103 of the first embodiment is replaced with a differential signal converter 203 and the charging pump circuit 1042 of the first embodiment is replaced with a charging pump circuit 2041. The other components of the third embodiment are the same as the counterparts of the first embodiment. Thus, those like components are identified by the same reference numeral and the description thereof will be omitted herein. In the illustrated embodiment, the first and second input signals 101 and 102 provided to the jitter detector 30 are supposed to have approximately equal frequencies when stabilized.

The differential signal converter 203 converts the input signal 101 into differential signals 101a and 101b and also converts the input signal 102 into differential signals 102a and 102b. In this case, the differential signals 101a and 102a are non-inverted against the input signals 101 and 102, respectively. On the other hand, the differential signals 101b and 102b are inverted against the input signals 101 and 102, respectively.

Suppose the logical values represented by the input signals 101 and 102 are A and B and A1=A, A2=(NOT A), B1=B, B2=(NOT B). In that case, the following equation $$A(EXOR)B = A \cdot (NOT\ B) + (NOT\ A) \cdot B = A1 \cdot B2 + A2 \cdot B1$$

is generally met, where "·" denotes an AND operation and "+" denotes an OR operation. The logical values of the differential signals 101a, 101b, 102a and 102b can be represented as A1, A2, B1 and B2, respectively. That is to say, the operation of the comparison pulse generator 103 shown in FIG. 2 (i.e., the EXOR gate 1032) is implementable by a combination of AND logic and OR logic.

Figure 10:
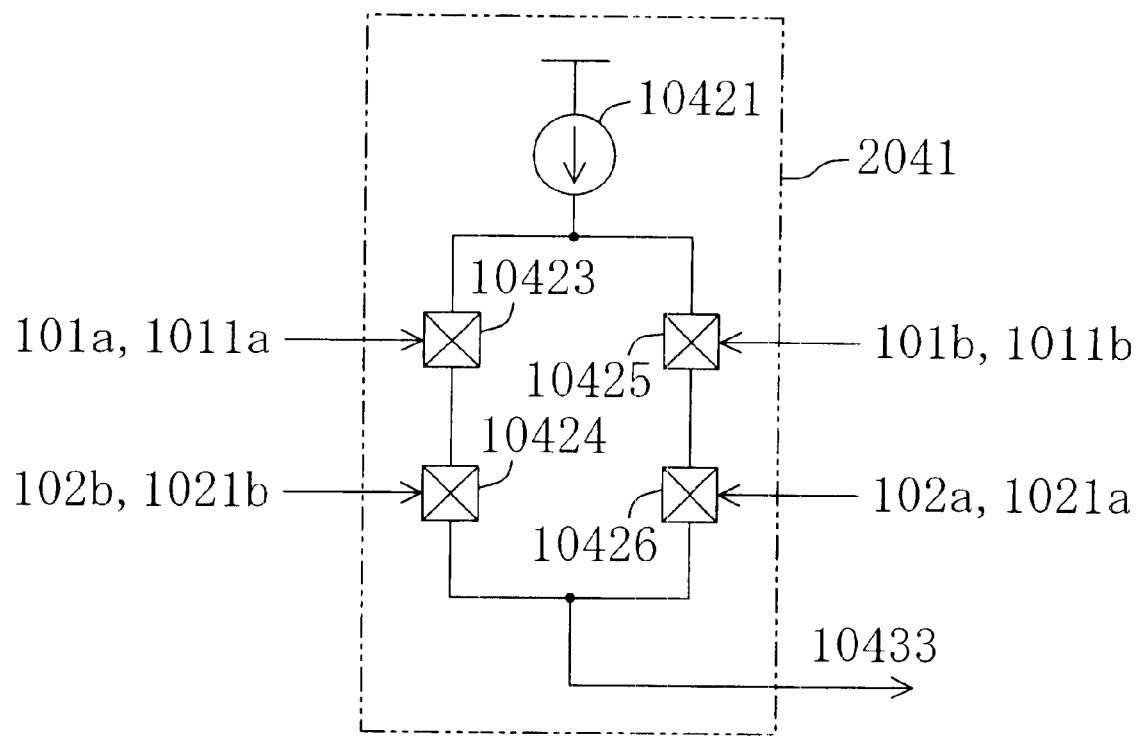
FIG. 10 is a circuit diagram illustrating a configuration for the charging pump circuit shown in FIG. 9.

FIG. 10 is a circuit diagram illustrating a configuration for the charging pump circuit 2041. As shown in FIG. 10, the charging pump circuit 2041 includes a switch circuit in which a serial connection of switches 10423 and 10424 and another serial connection of switches 10425 and 10426 are connected in parallel to each other. The differential signals 101a and 102b are provided as control inputs to the switches 10423 and 10424, respectively. The differential signals 101b and 102a are provided as control inputs to the switches 10425 and 10426, respectively. That is to say, the charging pump circuit 2041 shown in FIG. 10 is obtained by replacing the switch 10422 shown in FIG. 4 with this switch circuit. A current pulse, output from this switch circuit, is a phase difference comparison pulse representing a result of the EXOR operation performed on the first and second input signals 101 and 102.

Accordingly, by using the charging pump circuit 2041 shown in FIG. 10, the charge representing the phase difference can be stored on the capacitor 10431 as described for the first embodiment. On the remaining stages, the jitter detector 30 will operate in the same way as the counterpart of the first embodiment.

Embodiment 4

Figure 11:
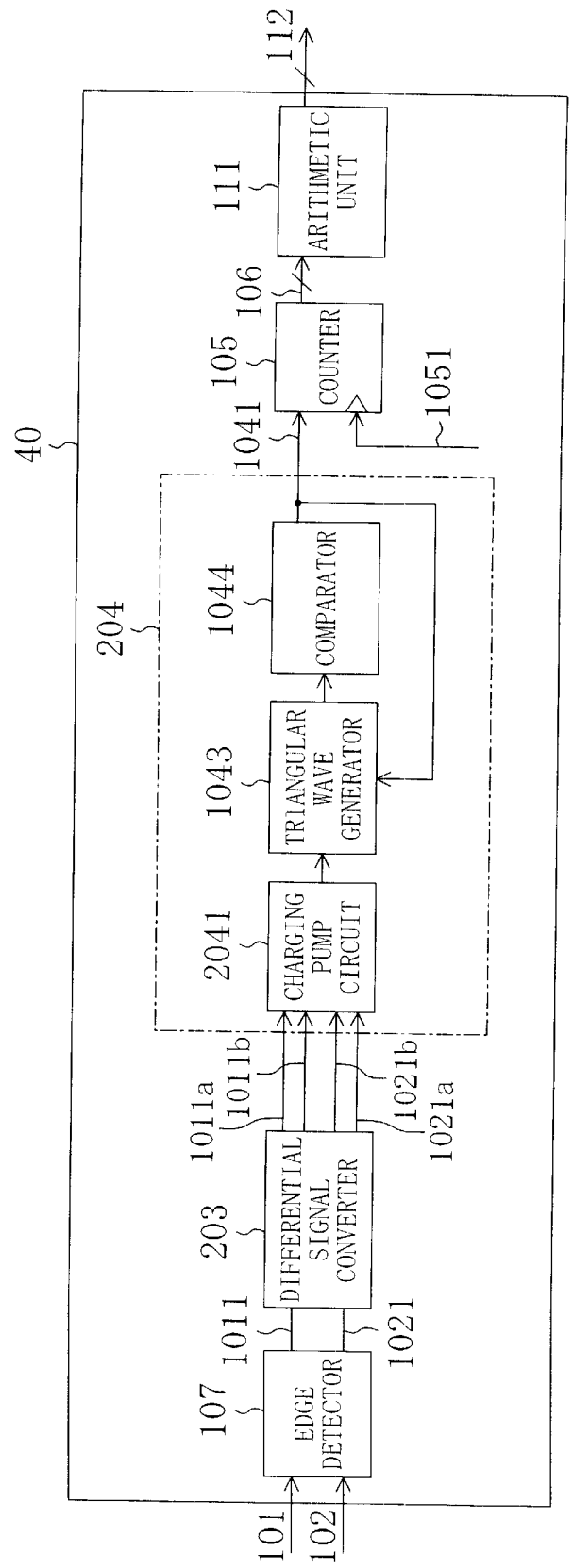
FIG. 11 is a block diagram illustrating a configuration for a jitter detector according to a fourth embodiment of the present invention.
Figure 12:
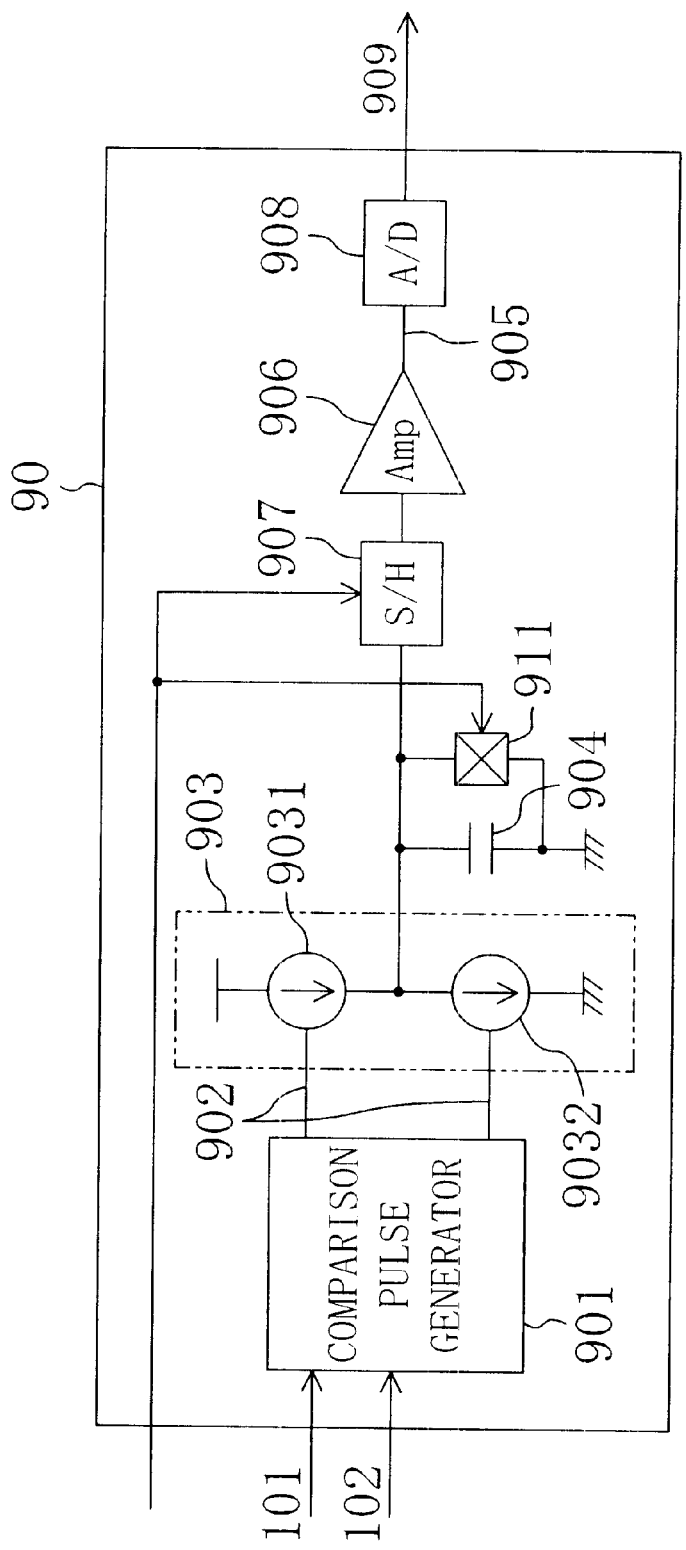
FIG. 12 is a circuit diagram illustrating a configuration for a known phase difference detector.

FIG. 11 is a block diagram illustrating a configuration for a jitter detector 40 according to a fourth embodiment of the present invention. In the jitter detector 40 shown in FIG. 11, the edge detector 107 shown in FIG. 7 is added to the jitter detector 30 shown in FIG. 9. The other components of the fourth embodiment are the same as the counterparts of the third embodiment. Thus, those like components are identified by the same reference numeral and the description thereof will be omitted herein. In this embodiment, a situation where the frequency of the second input signal 102 is approximately n times as high as that of the first input signal 101 in a stabilized state will be described.

In the jitter detector 40 shown in FIG. 11, the first and second timing signals 1011 and 1021 output from the edge detector 107 are the inputs of the differential signal converter 203. The differential signal converter 203 converts the first timing signal 1011 into differential signals 1011a and 1011b and also converts the second timing signal 1021 into differential signals 1021a and 1021b. In this case, the differential signals 1011a and 1021a are non-inverted against the first and second timing signals 1011 and 1021, respectively. On the other hand, the differential signals 1011b and 1021b are inverted against the first and second timing signals 1011 and 1021, respectively.

As in the third embodiment, the differential signals 1011a, 1011b, 1021a and 1021b (instead of the differential signals 101a, 101b, 102a and 102b) are subsequently input to the charging pump circuit 2041 as shown in FIG. 10. On the remaining stages, the jitter detector 40 will operate in the same way as the counterpart of the third embodiment.

In the second through fourth embodiments, a circuit obtained by removing the arithmetic unit 111 from the jitter detector also operates as a phase difference detector. Each phase difference detector can output a digital value corresponding to an averaged phase difference between the two input signals 101 and 102.

As described in the foregoing embodiments, the inventive jitter detector converts a phase difference between input signals into a charge quantity and then into a periodic signal. The period of the periodic signal is defined as an interval in which the charge is stored on a capacitor and which is equal to a time taken for the voltage of the capacitor to reach a constant reference voltage. Thus, by measuring the storage time (i.e., the period of the periodic signal) based on the period of a clock signal, a digital value corresponding to an averaged phase difference between the two input signals can be obtained. And by detecting a variation in the digital value, the amount of jitter between the input signals can also be measured easily.

As is apparent from the foregoing description, jitter and an average or variance thereof can be calculated easily according to the present invention. In particular, any of various types of PLL circuits can have the jitter of its output measured easily.

What is claimed is:

1. A jitter detector for detecting and outputting jitter between first and second input signals as a variation in period of a periodic signal by:

receiving the first and second input signals and a clock signal;

sequentially accumulating phase differences between the first and second input signals;

generating the periodic signal every time a result of the accumulation exceeds a predetermined value; and obtaining the period of the periodic signal based on a period of the clock signal.

2. A phase difference detector for outputting a phase difference between first and second input signals as a period of a periodic signal by:

receiving the first and second input signals and a clock signal;

sequentially accumulating phase differences between the first and second input signals;

generating the periodic signal every time a result of the accumulation exceeds a predetermined value; and obtaining the period of the periodic signal based on a period of the clock signal.

3. A method for detecting jitter between first and second input signals as a variation in period of a periodic signal, the method comprising the steps of:

sequentially accumulating phase differences between the first and second input signals;

generating the periodic signal every time a result of the accumulation exceeds a predetermined value; and obtaining the period of the periodic signal based on a period of a clock signal.

* * * * *